United States Patent
Jeong (10) Patent No.: US 7,221,598 B2
(45) Date of Patent: May 22, 2007

(54) METHOD OF CONTROLLING PROGRAM OPERATION OF FLASH MEMORY DEVICE WITH REDUCED PROGRAM TIME

(75) Inventor: Byoung Jeong, Jeonrabuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/306,472

(22) Filed: Dec. 29, 2005

(65) Prior Publication Data
US 2007/0002614 A1 Jan. 4, 2007

(30) Foreign Application Priority Data
Jun. 29, 2005 (KR) ...................... 10-2005-0057315

(51) Int. Cl.
*G11C 16/04* (2006.01)
*G11C 16/06* (2006.01)
(52) U.S. Cl. ........................... 365/185.28; 365/185.03; 365/185.22; 365/185.33
(58) Field of Classification Search ............ 365/185.28
See application file for complete search history.

(56) References Cited

U.S. PATENT DOCUMENTS 6,836,431 B2 * 12/2004 Chang ................... 365/185.03
7,016,230 B2 * 3/2006 Hosono ................. 365/185.17
2006/0104112 A1 * 5/2006 Hosono et al. ........ 365/185.01
2006/0215453 A1 * 9/2006 Seong ................... 365/185.12

* cited by examiner

*Primary Examiner*—Son L. Mai
(74) *Attorney, Agent, or Firm*—Marshall, Gerstein & Borun LLP (57) ABSTRACT

A method of controlling a program operation of a flash memory device includes performing a first program process of programming lower bit program data into MLCs of a selected page, a second program process of programming upper bit program data into the MLCs of the selected page, a first verify process of verifying whether all MLCs of the selected page have been programmed, transferring first lower sensing data to the upper bit registers so that the upper bit program data is stored in upper bit registers of all page buffers in order for MLCs to be consecutively programmed though the program operation has been completed during the second program process, and repeatedly performing the second program process, the first verify process and transferring the first lower sensing data until the MLCs of the selected page are completely programmed.

12 Claims, 8 Drawing Sheets

METHOD OF CONTROLLING PROGRAM OPERATION OF FLASH MEMORY DEVICE WITH REDUCED PROGRAM TIME

BACKGROUND

This disclosure relates to flash memory devices, and more particularly, to a method of controlling a program operation of flash memory devices including multi-level cells.

In general, memory cells of a flash memory device can be classified into a Single Level Cell (SLC) and a Multi Level Cell (MLC) depending on the bit number of data stored therein. 1-bit data having a logic value of "1" or "0" can be stored in the SLC. 2-bit data having a logic value of one of "11", "10", "01" and "00" can be stored in the MLC. Therefore, flash memory devices including MLCs are mainly used in high-integration semiconductor devices requiring a large capacity of data storage space. The program operation of a flash memory device including MLCs is executed on a page basis. In more detail, as a word line bias voltage for program is applied to word lines to which MLCs of a selected page are connected, the MLCs are programmed. In general, the threshold voltage of the MLC is varied with the program operation proceeding.

In more detail, the threshold voltage of an MLC (i.e., an erased cell) in which data of "11" is stored is Vt1 and the threshold voltage of an MLC in which data of "10" is stored is Vt2. Furthermore, the threshold voltages of MLCs in which data of "00" and "01" are respectively stored are Vt3 and Vt4. The voltages (Vt1 to Vt4) have the relation of Vt4>Vt3>Vt2>Vt1. Therefore, the threshold voltage (Vt4) of the MLC in which data of "01" is stored is the highest and the threshold voltage (Vt1) of the MLC in which data of "11" is stored is the lowest. The program operation process of the flash memory device including these MLCs will be described in more detail with reference to FIG. 1.

Figure 1:
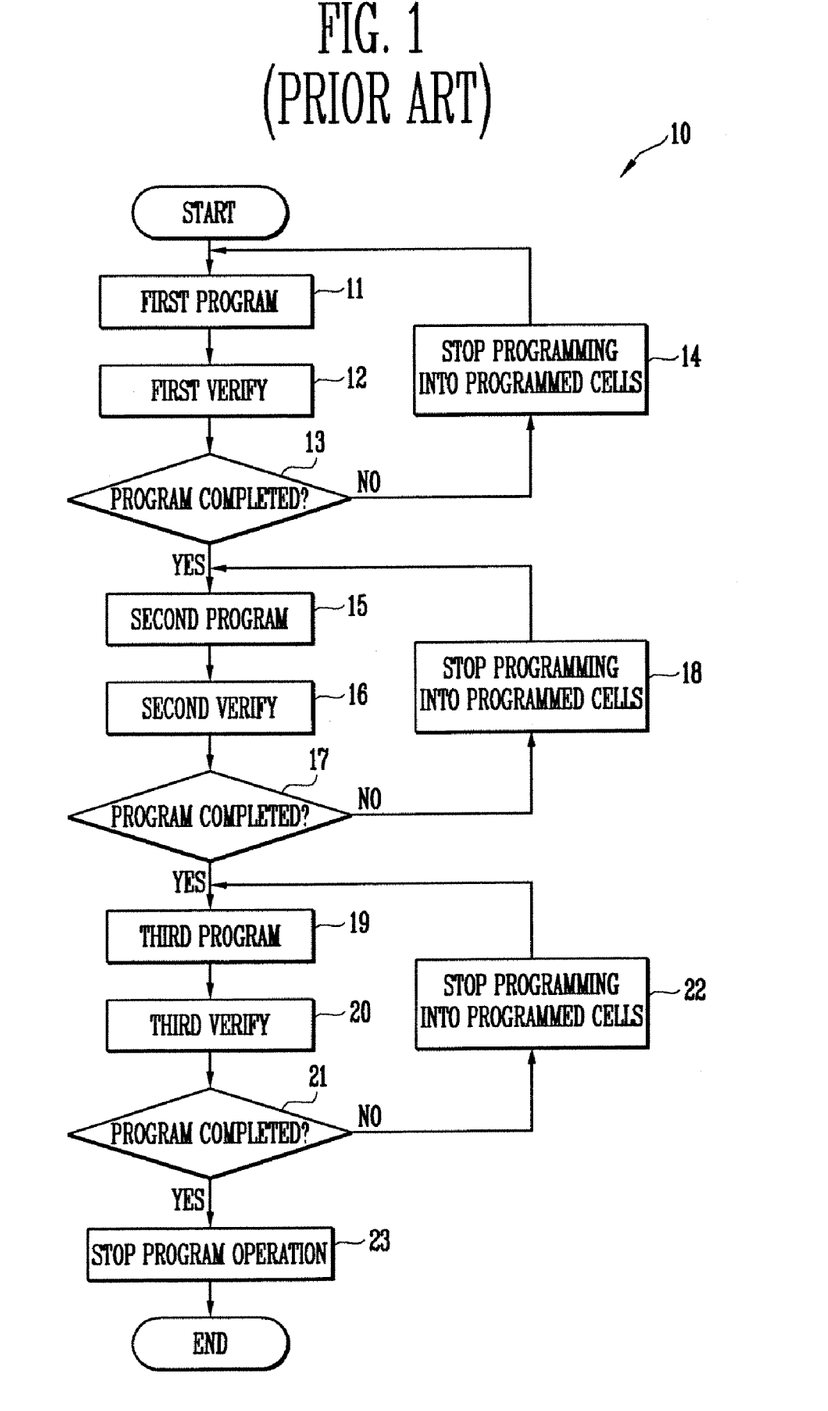
FIG. 1 is a flowchart illustrating a program process of a flash memory device in the related art.

As shown in FIG. 1, the program process 10 of the flash memory device including the MLCs includes three program processes and three verify processes. In the first program process at block 11, the threshold voltage of the MLC is changed from Vt1 to Vt2 (a voltage corresponding to data "10"). In the first verify process at block 12, it is verified whether all MLCs to be programmed have been programmed. At this time, in the case of cells whose operating speed is fast (i.e., a fast cell), it means that the program has been completed as determined at block 13. In the case of cells whose operating speed is slow (i.e., a slow cell), it means that the program has not yet been completed and programming into programmed cells in stopped at block 14. Therefore, for a re-program operation of the slow cells, the program operation of the fast cells is prohibited. As a result, the program operation on the fast cells is not performed until the program operation of the slow cells is completed.

Even in the second and third program processes at blocks 15, 19, respectively, in the same manner as the aforementioned first program process, the program is prohibited so that a next program step is not performed until the slow cells are all programmed even though the fast cells are already programmed. In the second and third verify processes 16, 17, respectively, it is verified whether all MLCs to be programmed have been programmed, and the program is completed or not completed as determined at blocks 17, 21, respectively, in the same manner as the aforementioned process. If not completed, programming into programmed cells is stopped at blocks 18, 22, respectively. If completed after the third verify process at block 20, the program operation is stopped at block 23. Therefore, a problem arises because the whole program time of the flash memory device is increased.

In more detail, for example, there is a case where data of "01" are programmed into the fast cells and data of "00" are programmed into the slow cells. In this case, the program operation of the fast cells is prohibited until the threshold voltage of the slow cells becomes a threshold voltage level corresponding to data of "00" even though the threshold voltage of the fast cells becomes the threshold voltage level corresponding to data of "00" by means of the first and second program processes.

Thereafter, if the threshold voltage of the slow cells becomes a threshold voltage level corresponding to data of "00", the program operation of the fast cells is again performed, so that the threshold voltage of the fast cells is changed from the threshold voltage corresponding to data of "00" to the threshold voltage corresponding to data of "01". In the method of controlling the program operation of the flash memory device in the related art, however, the program operation of the fast cells is delayed due to the slow cells as described above. Therefore, a problem arises because an overall program time is increased.

SUMMARY

A method of controlling a program operation of a flash memory device including a plurality Multi Level Cells of (MLCs) that share word lines and bit lines, performing a first program process of programming lower bit program data into MLCs of a selected page, performing a second program process of programming upper bit program data into the MLCs of the selected page, performing a first verify process of verifying whether all MLCs of the selected page have been programmed by applying a first verify voltage to the MLCs of the selected page, transferring first lower sensing data, which is stored in lower bit registers of the page buffers during the second program process, to the upper bit registers so that the upper bit program data is stored in upper bit registers of all page buffers respectively connected to the bit lines in order for MLCs on which a program operation has to be performed to be consecutively programmed though the program operation has been completed during the second program process, and repeatedly performing the second program process, the first verify process and transferring the first lower sensing data until the MLCs of the selected page are completely programmed.

DETAILED DESCRIPTION

Figure 2:
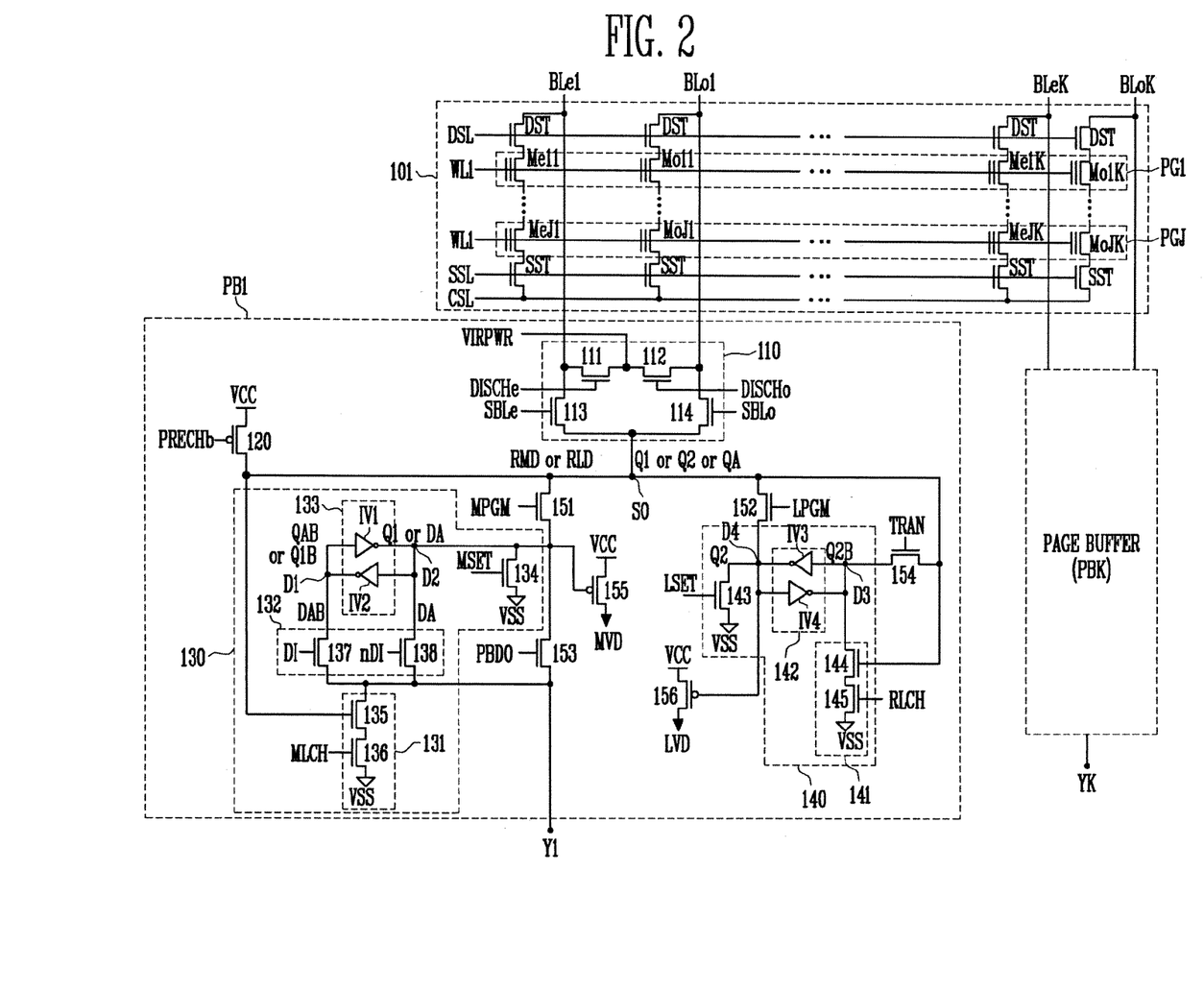
FIG. 2 is a circuit diagram of an example of a memory cell array and page buffer circuits for illustrating a method of controlling the program operation of a flash memory device.

FIG. 2 is a circuit diagram of a memory cell array and page buffer circuits for illustrating an example of a method of controlling the program operation of a flash memory device.

Referring to FIG. 2, the memory cell array 101 includes MLCs Me11 to MeJK, Mo11 to MoJK (where J, K are integers) that share bit lines BLe1 to BLeK, BLo1 to BloK (where K is an integer) and word lines WL1 to WLJ. The memory cell array 101 further includes drain select transistors DST connected to a drain select line DSL and source select transistors SST connected to a source select line SSL. In the memory cell array 101, the same word lines such as MLCs Me11 to Me1K, Mo11 to Mo1K are connected to WL1 form one page PG1.

Each of a plurality of page buffers PB1 to PBK (where K is an integer) is connected to a pair of bit lines. For example, the page buffer PB1 can be connected to the bit lines BLe1, BLo1. The construction and operation of the page buffers PB1 to PBK are the same. Therefore, only the page buffer PB1 will be described as an example. The page buffer PB1 includes a bit line select circuit 110, a precharge circuit 120, an upper bit register 130, a lower bit register 140, switches 151 to 154, an upper bit verify circuit 155 and a lower bit verify circuit 156.

The bit line select circuit 110 selects one of the bit lines BLe1, BLo1 in response to bit line select signals (SBLe, SBLo) and discharge signals (DISCHe, DISCHo), and connects the selected bit line BLe1 or BLo1 to a sensing node SO. The bit line select circuit 110 includes NMOS transistors 111 to 114. The operation of the NMOS transistors 111 to 114 is well known to those skilled in the art. Description thereof will be omitted.

The precharge circuit 120 precharges the sensing node SO with an internal voltage (VCC) level in response to a precharge control signal (PRECHb).

The upper bit register 130 includes a sensing circuit 131, a data input circuit 132, a latch circuit 133 and a latch reset circuit 134. The sensing circuit 131 includes NMOS transistors 135, 136. The sensing circuit 131 senses a voltage of the sensing node SO in response to a latch signal (MLCH) and discharges a data I/O node Y1 with a ground voltage (VSS) level. The data input circuit 132 includes NMOS transistors 137, 138. The NMOS transistor 137 is connected between a node D1 and the data I/O node Y1 and is turned on or off in response to a data input signal (DI). The NMOS transistor 138 is connected between a node D2 and the data I/O node Y1 and is turned on or off in response to a data input signal (nDI). The latch circuit 133 includes inverters IV1, IV2. The latch circuit 133 latches upper sensing data (Q1B or Q1) received through the node D1 or D2. Furthermore, the latch circuit 133 latches input data (DAB or DA) received through the node D1 or D2. The latch reset circuit 134 is connected to the node D2 and initializes the latch circuit 133 in response to the reset control signal (MSET).

The lower bit register 140 includes a sensing circuit 141, a latch circuit 142 and a latch reset circuit 143. The sensing circuit 141 includes NMOS transistors 144, 145. The sensing circuit 141 senses a voltage of the sensing node SO in response to a latch signal (RLCH) and outputs a lower sensing data (Q2B) to a node D3. The latch circuit 142 includes inverters IV3, IV4. The latch circuit 142 latches the lower sensing data (Q2B) received through the node D3 and outputs latched lower sensing data (Q2) to a node D4. The latch reset circuit 143 is connected to the node D4 and initializes the latch circuit 142 in response to a reset control signal (LSET).

Each of the switches 151 to 154 can be implemented using a NMOS transistor. For convenience of explanation, each of the switches 151 to 154 will be referred to as a NMOS transistor. The NMOS transistor 151 is connected between the sensing node SO and the node D2 and is turned on or off in response to a program control signal (MPGM). The NMOS transistor 152 is connected between the sensing node SO and the node D4 and is turned on or off in response to a program control signal (LPGM). The NMOS transistor 153 is connected between the node D2 and the data I/O node Y1 and is turned on or off in response to a data output signal (PBDO). The NMOS transistor 154 is connected between the node D3 and the sensing node SO and is turned on or off in response to a data transfer signal (TRAN).

Each of the upper bit verify circuit 155 and the lower bit verify circuit 156 can be implemented using a PMOS transistor. The upper bit verify circuit 155 outputs upper verify data (MVD) in response to the inverted upper sensing data (Q1) received through the node D2. When the inverted upper sensing data (Q1) are logic "0", the upper bit verify circuit 155 can output the upper verify data (MVD) of logic "1". Furthermore, when the inverted upper sensing data (Q1) are logic "1", the upper bit verify circuit 155 can output the upper verify data (MVD) of logic "0".

The lower bit verify circuit 156 outputs lower verify data (LVD) in response to the inverted lower sensing data (Q2) received through the node D4. When the inverted lower sensing data (Q2) are logic "0", the lower bit verify circuit 156 can output the lower verify data (LVD) of logic "1". Furthermore, when the inverted lower sensing data (Q2) are logic "1", the lower bit verify circuit 156 can output the lower verify data (LVD) of logic "0".

An example of a process of controlling a program operation of the flash memory device will be described in detail with reference to FIGS. 2 to 8. For convenience of explanation, a case where the MLCs Me11 to Me1K of the page PG1 are selected and are programmed will be described as an example. Furthermore, only the operation of the page buffer PB1 will be described.

Figure 3:
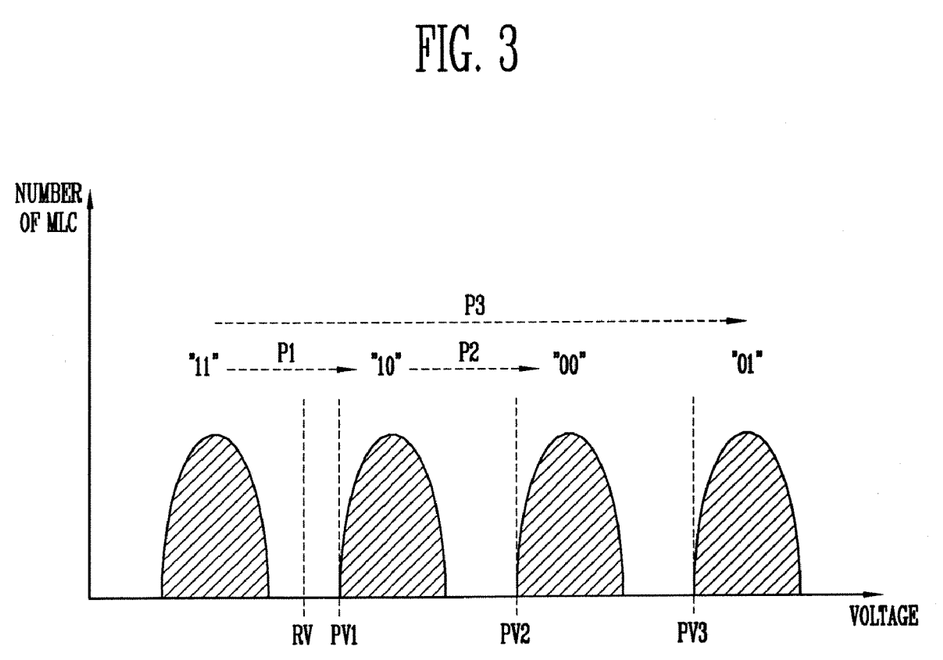
FIG. 3 is a graph showing threshold voltage distribution of an MLC depending on a process of controlling a program operation of a flash memory device.
Figure 4:
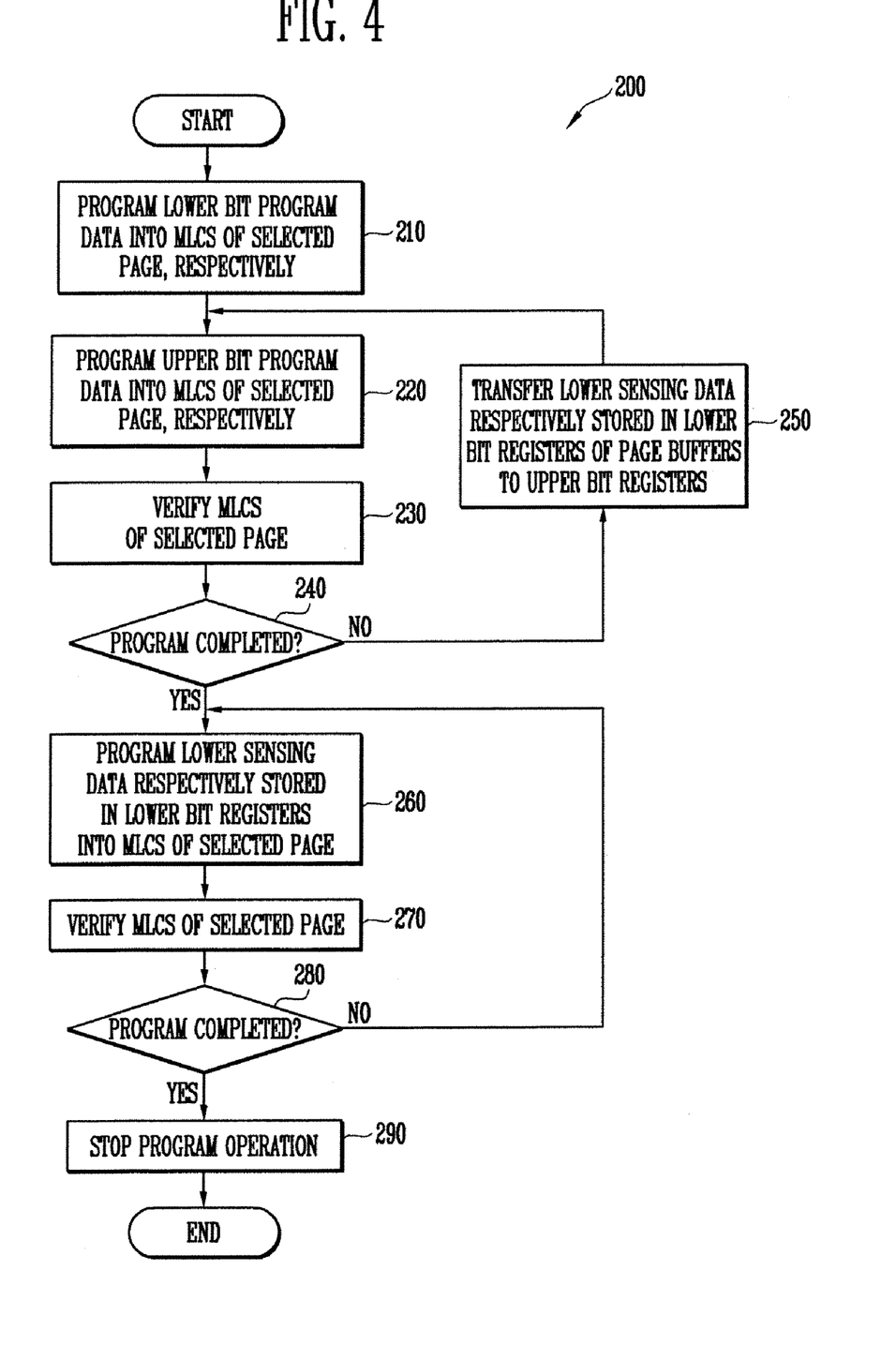
FIG. 4 is a flowchart illustrating an example of a process of controlling a program operation of a flash memory device.

FIG. 3 is a graph showing threshold voltage distribution of a MLC depending on the process of controlling the program operation of the flash memory device. FIG. 4 is a flowchart illustrating an example of the process 200 of controlling the program operation of the flash memory device. Referring to FIG. 4, lower bit program data (not shown) are programmed into the MLCs Me11 to Me1K at block 210. An example of the program process at block 210 will be described below in more detail with reference to FIG. 5.

Figure 5:
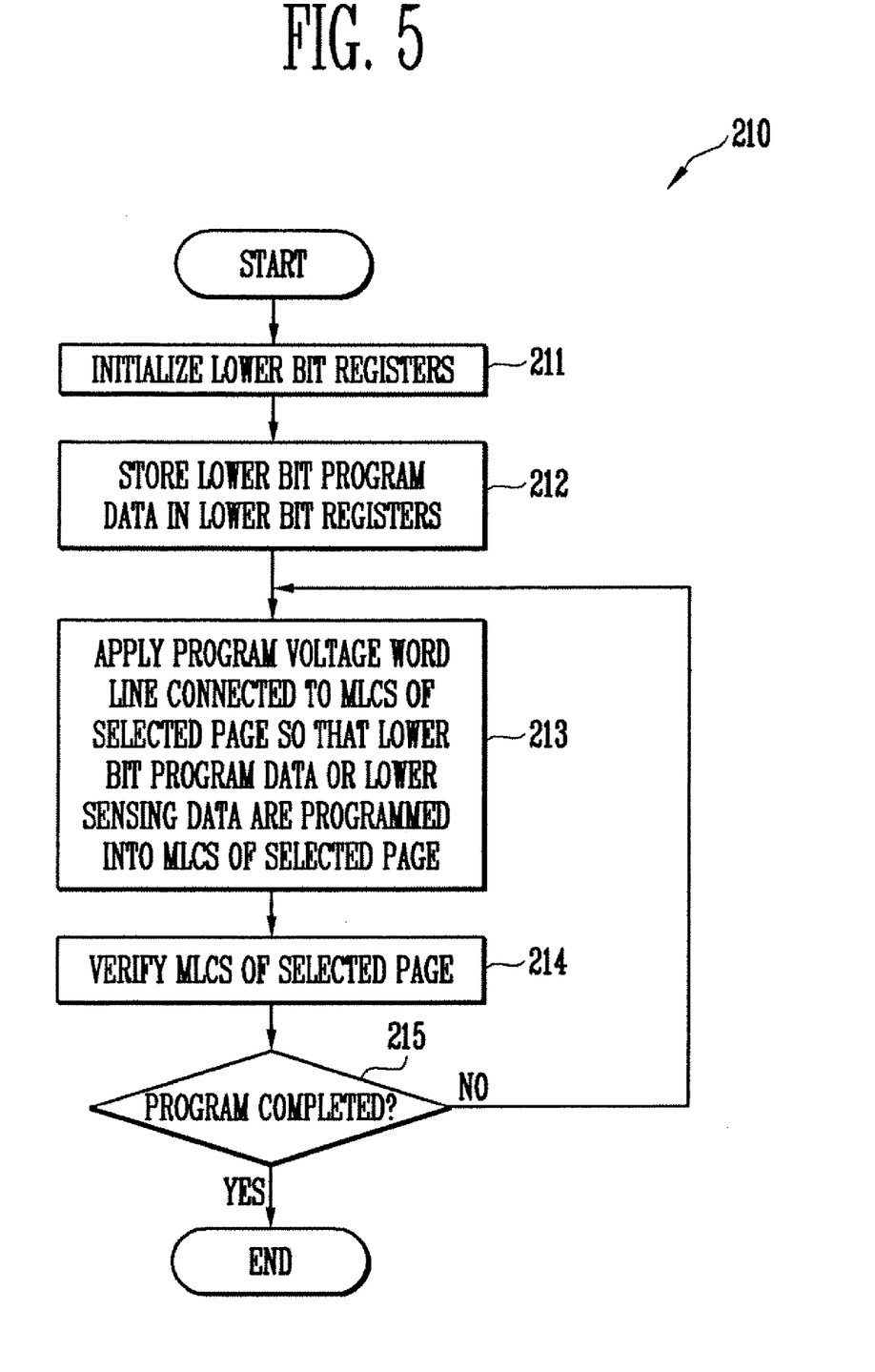
FIG. 5 is a detailed flowchart illustrating an example of a program process shown in FIG. 4.

Referring to FIG. 5, the lower bit registers 140 of the page buffers PB1 to PBK are initialized at block 211. In more detail, the latch reset circuit 143 discharges the node D4 with the ground voltage (VSS) level in response to the reset control signal (LSET). As a result, the latch circuit 142 of each of the lower bit registers 140 is initialized. Thereafter, lower bit program data are stored in the lower bit registers 140 at block 212. This can be realized in such a manner that the input data (DA) stored in the latch circuit 133 is transferred to the lower bit register 140 through the PMOS transistor 151 and the sensing node SO by the data input circuit 132 of the upper bit register 130. A program voltage (not shown) is applied to the word line WL1 so that the lower bit program data or the lower sensing data (Q2) is programmed into the MLCs Me11 to Me1K at block 213. As block 213 is performed, threshold voltages of the MLCs Me11 to Me1K are changed from data "11" to a voltage level corresponding to data "10" (refer to P1 in FIG. 3).

Thereafter, as a verify voltage (refer to PV1 in FIG. 3) is applied to the word line WL1, whether or not the MLCs Me11 to Me1K have been completely programmed is verified at block 214. The verify voltage (PV1) can be set to be higher than a threshold voltage of an erased MLC (i.e., a MLC in which data of "11" is stored) and can be set to be lower than a threshold voltage of an MLC in which data of "10" is stored, as shown in FIG. 3. An example of the verify process of block 214 will be described below in more detail with reference to FIG. 6.

Figure 6:
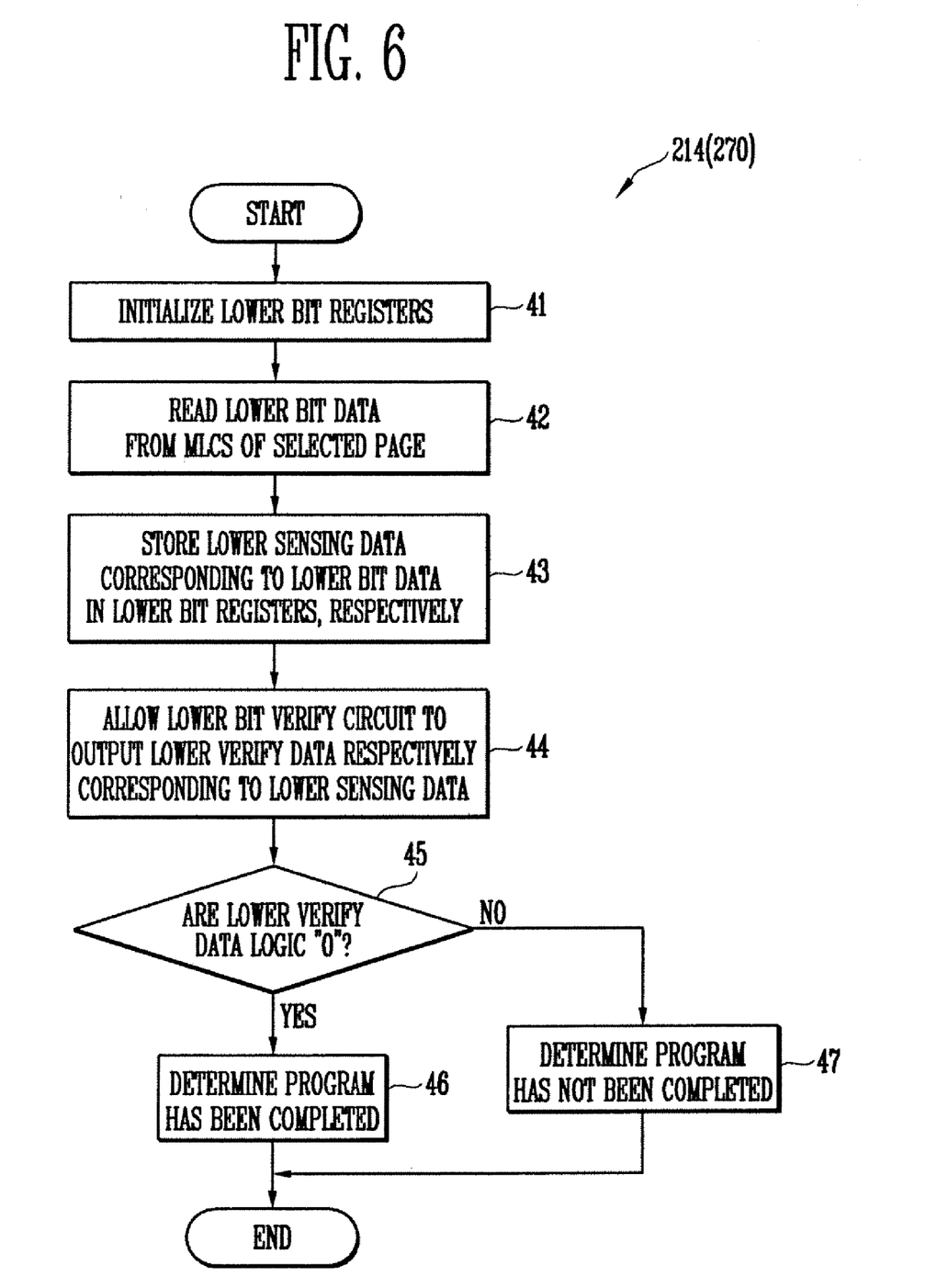
FIG. 6 is a detailed flowchart illustrating an example of a verify process shown in FIG. 5.

In reference to FIG. 6, similar to block 211, the lower bit registers 140 of the page buffers PB1 to PBK are initialized at block 41. Thereafter, as the verify voltage (PV1) is applied to the word line WL1, the lower bit data (RLD) is read from each of the MLCs Me11 to Me1K at block 42. The lower bit register 140 of each of the page buffers PB1 to PBK senses the lower bit data (RLD) in response to the latch signal (RLCH) and stores the lower sensing data (Q2B) therein at block 43. In the case where the MLCs Me11 to Me1K are programmed, the read lower bit data (RLD) can be logic "1". In the case where the MLCs Me11 to Me1K are not programmed, the read lower bit data (RLD) can be logic "0". Furthermore, when the lower bit data (RLD) is logic "1", the lower sensing data (Q2B) can be logic "0". When the lower bit data (RLD) is logic "0", the lower sensing data (Q2B) can be logic "1".

The lower bit verify circuit 156 of each of the page buffers PB1 to PBK outputs the lower verify data (LVD) in response to the lower sensing data (Q2B) at block 44. At this time, when the lower verify data (LVD) is logic "0", it is determined that the MLCs Me11 to Me1K have been completely programmed at blocks 45, 46. Whether the MLCs Me11 to Me1K have been programmed can be determined by comparing a logic value of the lower verify data (LVD) with a reference value using a data compare circuit (not shown), etc. Furthermore, when the lower verify data (LVD) is logic "1", it is determined that the MLCs Me11 to Me1K have not been programmed at blocks 45, 47.

Referring back to FIG. 5, in the case where it is determined that the MLCs Me11 to Me1K have been programmed in the verify process at block 214, the program process at block 210 is finished as determined at block 215. Meanwhile, in the case where it is determined that the MLCs Me11 to Me1K have not been programmed in the verify process of block 214, blocks 213 to 215 are repeatedly performed until the MLCs Me11 to Me1K are programmed. The lower sensing data (Q2) corresponding the lower bit data (RLD) stored in the lower bit register 140 can be programmed into each of the MLCs Me11 to Me1K in the verify process at block 214 until block 213 is repeated after the verify process at block 214. Referring back to FIG. 4, the upper bit program data (not shown) is programmed into each of the MLCs Me11 to Me1K at block 220. An example of the program process at block 220 will be described below in more detail with reference to FIG. 7.

Figure 7:
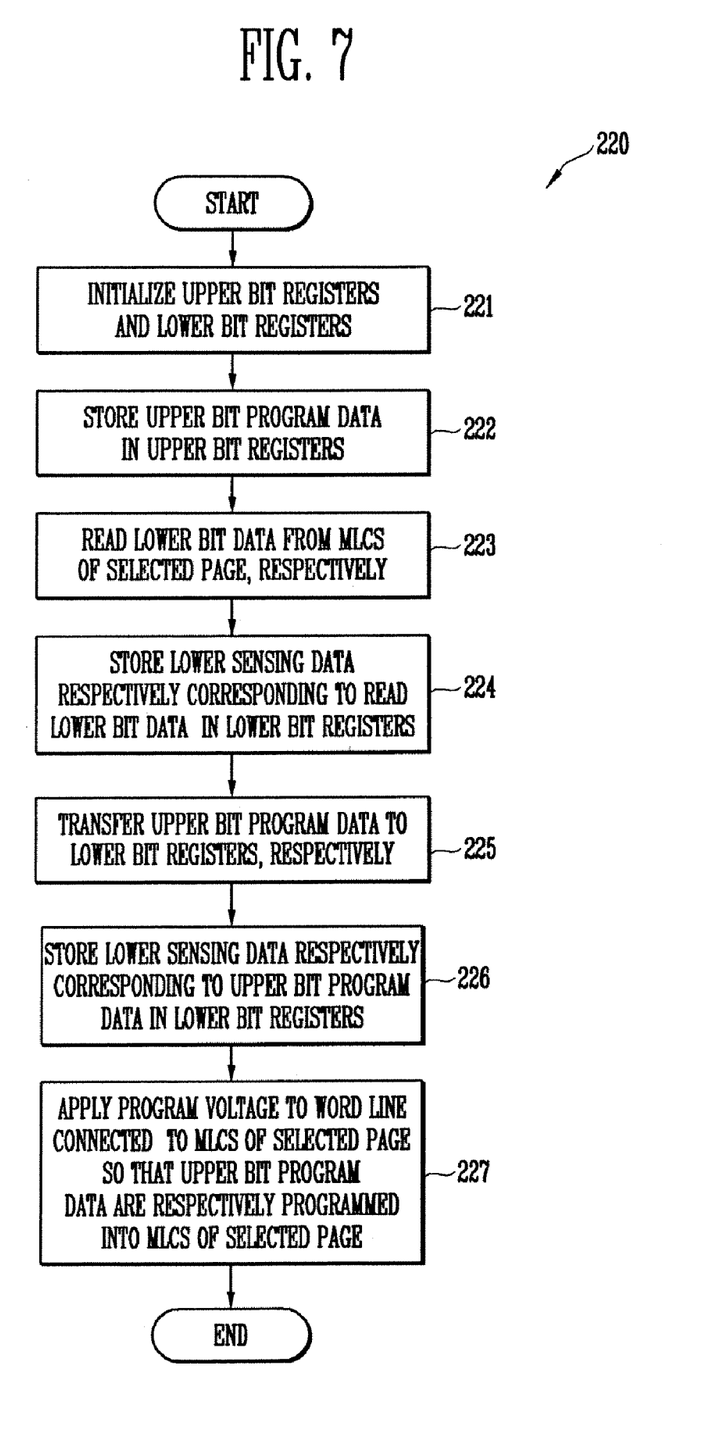
FIG. 7 is a detailed flowchart illustrating an example of a program process 220 shown in FIG. 4.

Referring to FIG. 7, the upper bit registers 130 and the lower bit registers 140 of the page buffers PB1 to PBK are initialized at block 221. In more detail, to initialize the upper bit registers 130, the precharge circuit 120 precharges the sensing node SO with the internal voltage (VCC) level in response to the precharge control signal (PRECHb). Thereafter, the sensing circuit 131 discharges the data I/O node Y1 with the ground voltage (VSS) level in response to the latch signal (MLCH) and a voltage (VCC) of the sensing node SO. At this time, the data input signal (DI) is enabled and the data input circuit 132 connects the node D1 to the data I/O node Y1. As a result, the sensing data (Q1B) of logic "0" is generated in the node D1. The latch circuit 133 of the upper bit register 130 latches the sensing data (Q1B), so that the sensing data (Q1B) is initialized. Furthermore, the initialization operation of the lower bit registers 140 is substantially the same as at block 211.

The upper bit program data are then stored in the upper bit registers 130 at block 222. In more detail, the data input circuit 132 connects the node D1 or the node D2 to the data I/O node Y1 in response to the data input signals (DI, nDI), so that the input data (DA) of logic "1" or "0" of the latch circuit 133 is stored as the upper bit program data.

Meanwhile, as a read voltage (refer to RV in FIG. 3) is applied to the word line WL1, the lower bit data (RLD) is read from each of the MLCs Me11 to Me1K at block 223. Each of the lower bit registers 140 senses the read lower bit data (RLD) in response to the latch signal (RLCH) and stores the lower sensing data (Q2B) therein at block 224. When the lower bit data (RLD) are logic "1", the lower sensing data (Q2B) can be logic "0", and when the lower bit data (RLD) are logic "0", the lower sensing data (Q2B) can be logic "1".

If the NMOS transistor 151 connects the node D2 to the sensing node SO in response to the program control signal (MPGM), the upper bit program data (DA) respectively stored in the upper bit registers 130 is transferred to the lower bit register 140 at block 225. Each of the lower bit registers 140 senses the upper bit program data (DA) in response to the latch signal (RLCH) and stores the lower sensing data (Q2B) therein at block 226. As a result, at block 224, the lower sensing data (Q2B) stored in the lower bit register 140 is updated. When the upper bit program data (DA) is logic "1", the updated lower sensing data (Q2B) can be logic "0". When the upper bit program data (DA) is logic "0", the updated lower sensing data (Q2B) can be logic "1". Thereafter, a program voltage is applied to the word line WL1 so that the upper bit program data (DA) is programmed into the MLCs Me11 to Me1K at block 227.

Referring back to FIG. 4, as a verify voltage (refer to PV2 in FIG. 3) is applied to the word line WL1, whether the MLCs Me11 to Me1K have been programmed is verified at block 230. The verify voltage (PV2) can be set to be higher than a threshold voltage of a MLC in which data of "10" is stored and can be set to be lower than a threshold voltage of a MLC in which data of "00" is stored, as shown in FIG. 3. An example of the verify process of block 230 will be described below in more detail with reference to FIG. 8.

Figure 8:
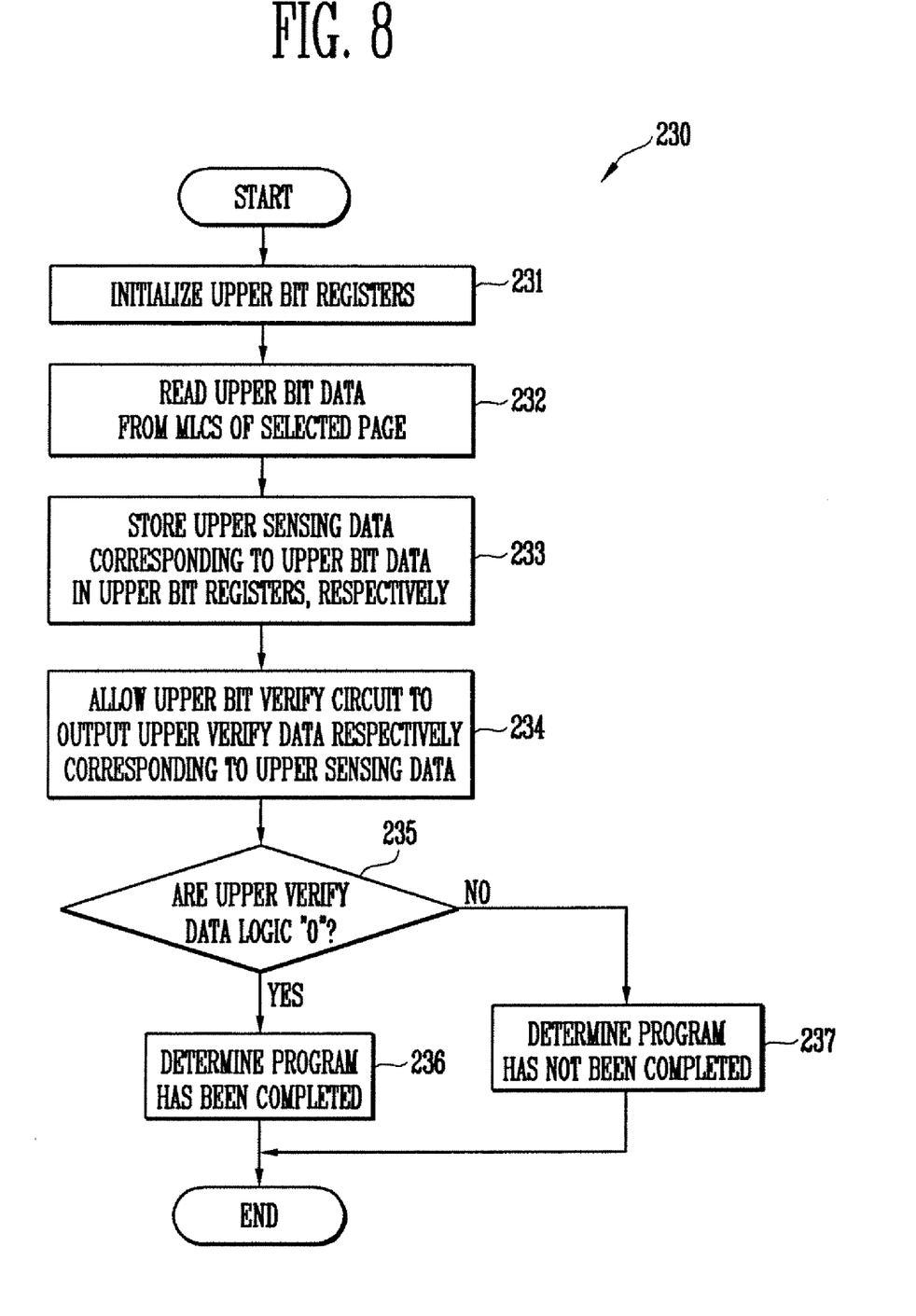
FIG. 8 is a detailed flowchart illustrating an example of a verify process 240 shown in FIG. 4.

Referring to FIG. 8, the upper bit registers 130 of the page buffers PB1 to PBK are initialized at block 231. In more detail, to initialize the upper bit registers 130, the precharge circuit 120 precharges the sensing node SO with the internal voltage (VCC) level in response to the precharge control signal (PRECHb). Thereafter, the sensing circuit 131 discharges the data I/O node Y1 with the ground voltage (VSS) level in response to the latch signal (MLCH) and the voltage (VCC) of the sensing node SO. At this time, the data input signal (nDI) is enabled and the data input circuit 132 connects the node D2 to the data I/O node Y1. As a result, the sensing data (Q1) of logic "0" is generated in the node D2. The latch circuit 133 of the upper bit register 130 latches the sensing data (Q1), so that the sensing data (Q1) is initialized.

As the verify voltage (PV2) is applied to the word line WL1, the upper bit data (RMD) is read from each of the MLCs Me11 to Me1K at block 232. The upper bit register 130 of each of the page buffers PB1 to PBK senses the read upper bit data (RMD) in response to the latch signal (MLCH) and the data input signal (DI), stores the upper sensing data (Q1B) therein, and outputs the upper sensing data (Q1) to the node D2 at block 233. When the upper bit data (RMD) are logic "1", the upper sensing data (Q1) can be changed to logic "1". When the upper bit data (RMD) are logic "0", the upper sensing data (Q1) can be kept to logic "0" (i.e., an initialized state).

The upper bit verify circuits 155 of the page buffers PB1 to PBK output the upper verify data MVD in response to the upper sensing data (Q1) at block 234. At this time, when the upper verify data (MVD) is logic "0", it is determined that the MLCs Me11 to Me1K have been completely programmed at blocks 235, 236. Furthermore, when the upper verify data (MVD) is logic "1", it is determined that the MLCs Me11 to Me1K have not been completely programmed at blocks 235, 237.

Referring back to FIG. 4, if it is determined that the MLCs Me11 to Me1K have not been completely programmed in the verify process of block 230, as determined at block 240, the lower sensing data (Q2B), which has been updated based on the upper bit program data (DA) at block 225 and stored in the lower bit registers 140 of the page buffers PB1 to PBK, are transferred to the upper bit registers 130 at block 250.

In more detail, as the NMOS transistor 154 connects the node D3 to the sensing node SO in response to the data transfer signal (TRAN), the lower sensing data (Q2B) is transferred to the upper bit register 130 through the sensing node SO. The upper bit register 130 senses the lower sensing data (Q2B) in response to the latch signal (MLCH) and the data input signal (nDI) and stores the upper sensing data (Q1) therein. The reason why the process of block 250 is performed is that MLCs on which a program operation has to be consecutively performed (i.e., MLCs into which data of "01" has to be programmed) can be consecutively programmed without stop although the program operation has been completed in the program process of block 220 (i.e., data of "00" has been programmed). As a result, the upper sensing data (Q1) (i.e., upper bit program data) of logic "0" is stored in the upper bit register 130 of a page buffer corresponding to MLCs whose threshold voltage has to be changed from the data "11" to a voltage level corresponding to the data "01" (see P3 in FIG. 3) through the process of block 250.

Thereafter, blocks 220 to 240 are repeatedly performed until the MLCs Me11 to Me1K are completely programmed. When block 220 is repeated after the verify process of block 230, the upper sensing data (Q1), which is stored in the upper bit register 130 at block 250, is programmed into each of the MLCs Me11 to Me1K. As a result, at block 220, a threshold voltage of a part of the MLCs Me11 to Me1K is changed from the data "10" to a voltage level corresponding to the data "00" (see P2 in FIG. 3). The remaining threshold voltages are changed from the data "11" to a voltage level corresponding to the data "01" (see P3 in FIG. 3).

The lower sensing data (Q2), which has been updated based on the upper bit program data (DA) at block 225 and stored in the lower bit registers 140 of the page buffers PB1 to PBK, respectively, is then programmed into the MLCs Me11 to Me1K at block 260.

As the verify voltage (see PV3 in FIG. 3) is applied to the word line WL1, whether the MLCs Me11 to Me1K have been completely programmed is verified at block 270. Block 270 is substantially the same as the aforementioned block 214, which has been described with reference to FIG. 6, except for the verify voltage (PV3) applied to the word line WL1. Description thereof will be omitted. Whether the MLCs Me11 to Me1K have been completely programmed is determined depending on the verify result of the verify process of block 270 at block 280.

If it is determined that the MLCs Me11 to Me1K have been completely programmed at block 280, the program operation is stopped at block 290. Meanwhile, if it is determined that the MLCs Me11 to Me1K have not been completely programmed at block 280, blocks 260 to 280 are repeatedly performed until the MLCs Me11 to Me1K are completely programmed. After the verify process of block 270, when block 260 is repeated, the lower sensing data (Q2) corresponding to the lower bit data (RLD) are programmed into each of the MLCs Me11 to Me1K in the verify process of block 270.

As described above, in the method of controlling the program operation of the flash memory device, upper bit program data is stored in an upper bit register of MLCs into which data of "01" has to be programmed through the block 250. Therefore, corresponding MLCs can be consecutively programmed without stop. This can shorten an overall program time of the flash memory device.

As described above, in the method of controlling the program operation of the flash memory device, a program operation is consecutively performed on MLCs into which data of "01" is programmed. The whole program time can be shortened.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims literally or under the doctrine of equivalents.

What is claimed as new and desired to be protected by Letters Patent of the United States is:

1. A method of controlling a program operation of a flash memory device including a plurality of Multi Level Cells (MLCs) that share word lines and bit lines, comprising:

performing a first program process of programming lower bit program data into MLCs of a selected page, of the plurality of MLCs;

performing a second program process of programming upper bit program data into the MLCs of the selected page;

performing a first verify process of verifying whether all MLCs of the selected page have been programmed by applying a first verify voltage to the MLCs of the selected page;

transferring first lower sensing data, which is stored in lower bit registers of the page buffers during the second program process, to the upper bit registers so that the upper bit program data is stored in upper bit registers of all page buffers respectively connected to the bit lines in order for MLCs on which a program operation has to be performed to be consecutively programmed though the program operation has been completed during the second program process; and repeatedly performing the second program process, the first verify process and transferring the first lower sensing data until the MLCs of the selected page are completely programmed.

2. The method of claim 1, further comprising, after repeatedly performing the second program process, the first verify process and transferring the first lower sensing data, performing a third program process of programming first or second lower sensing data, which is stored in the lower bit registers, respectively, into the MLCs of the selected page;

performing a second verify process of verifying whether the program operation on the MLCs of the selected page has been completed by applying a second verify voltage to the MLCs of the selected page; and repeatedly performing the third program process and the second verify process until the program operation on the MLCs of the selected page is completed.

3. The method of claim 2, wherein the second verify voltage is higher than the first verify voltage.

4. The method of claim 2, wherein performing the second verify process comprises:

initializing the lower bit registers;

reading lower bit data from the MLCs of the selected page by applying the second verify voltage to the word line;

storing the second lower sensing data into the lower bit registers, respectively, corresponding to the read lower bit data;

allowing lower bit verify circuits of the page buffers to output lower verify data respectively corresponding to the second lower sensing data; and determining whether the program operation on the MLCs of the selected page has been completed based on logic levels of the lower verify data.

5. The method of claim 4, wherein during the third program process, the second lower sensing data is programmed into the MLCs of the selected page.

6. The method of claim 1, wherein performing the first verify process comprises:

initializing the upper bit registers;

reading upper bit data from the MLCs of the selected page by applying the first verify voltage to the MLCs of the selected page;

storing upper sensing data respectively corresponding to the read upper bit data in the upper bit registers;

allowing upper bit verify circuits of the page buffers to output upper verify data respectively corresponding to the upper sensing data; and determining whether the program operation on the MLCs of the selected page has been completed based on logic levels of the upper verify data.

7. The method of claim 1, wherein performing the first program process comprises:

initializing the lower bit registers;

storing the lower bit program data in the lower bit registers, respectively;

applying a program voltage to a word line connected to the MLCs of the selected page so that the lower bit program data or second lower sensing data are programmed into the MLCs of the selected page;

performing a second verify process of verifying whether the program operation has been completed on the MLCs of the selected page by applying a second verify voltage to the word line; and repeatedly applying a program voltage supply and performing the second verify process until the program operation is completed on the MLCs of the selected page.

8. The method of claim 7, wherein the second verify voltage is lower than the first verify voltage.

9. The method of claim 7, wherein performing the second verify process comprises:

initializing the lower bit registers;

reading lower bit data from the MLCs of the selected page by applying the second verify voltage to the word line;

storing the second lower sensing data corresponding to the read lower bit data in the lower bit registers, respectively;

allowing the lower bit verify circuits of the page buffers to output lower verify data respectively corresponding to the second lower sensing data; and determining whether the program operation has been completed on the MLCs of the selected page based on logic levels of the lower verify data.

10. The method of claim 9, wherein while applying a program voltage, which is performed after performing the second verify process, the second lower sensing data is programmed into the MLCs of the selected page, respectively.

11. The method of claim 1, wherein performing the second program process comprises:

initializing the upper bit registers and the lower bit registers;

storing the upper bit program data in the upper bit registers;

reading lower bit data from the MLCs of the selected page, respectively, by applying a read voltage to a word line connected to the MLCs of the selected page, and storing second lower sensing data respectively corresponding to the read lower bit data in the lower bit registers;

transferring the upper bit program data respectively stored in the upper bit registers to the lower bit registers, respectively, and storing the first lower sensing data respectively corresponding to the upper bit program data in the lower bit registers; and applying a program voltage to the word line so that the upper bit program data are programmed into the MLCs of the selected page.

12. The method of claim 11, wherein the read voltage is lower than the first verify voltage.

* * * * *